United States Patent
Campbell et al.

(10) Patent No.: US 8,266,802 B2
(45) Date of Patent: Sep. 18, 2012

(54) COOLING APPARATUS AND METHOD OF FABRICATION THEREOF WITH JET IMPINGEMENT STRUCTURE INTEGRALLY FORMED ON THERMALLY CONDUCTIVE PIN FINS

(75) Inventors: Levi A. Campbell, Poughkeepsie, NY (US); Richard C. Chu, Hopewell Junction, NY (US); Michael J. Ellsworth, Jr., Lagrangeville, NY (US); Madhusudan K. Iyengar, Woodstock, NY (US); Roger R. Schmidt, Poughkeepsie, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 1127 days.

(21) Appl. No.: 12/141,290

(22) Filed: Jun. 18, 2008

(65) Prior Publication Data
US 2009/0314467 A1    Dec. 24, 2009

(51) Int. Cl.
*B21D 53/02* (2006.01)
*F28F 7/00* (2006.01)
(52) U.S. Cl. .................... 29/890.03; 165/80.3; 165/80.4
(58) Field of Classification Search ............... 29/890.03, 29/890.05, 890.035; 165/80.3, 80.4, 185, 165/908; 361/695, 697, 699
See application file for complete search history.

(56) References Cited

U.S. PATENT DOCUMENTS

| | | | |
|---|---|---|---|
| 4,296,455 A * | 10/1981 | Leaycraft et al. ............. | 361/691 |
| 5,168,348 A * | 12/1992 | Chu et al. ...................... | 257/713 |
| 5,604,665 A * | 2/1997 | Chrysler et al. .............. | 361/703 |
| 6,431,260 B1 | 8/2002 | Agonafer et al. | |
| 6,519,151 B2 | 2/2003 | Chu et al. | |
| 6,622,786 B1 * | 9/2003 | Calmidi et al. ............... | 165/185 |
| 6,650,538 B1 * | 11/2003 | Chu et al. ...................... | 361/688 |
| 6,736,204 B2 * | 5/2004 | Gollan et al. ................. | 165/185 |
| 7,206,203 B2 | 4/2007 | Campbell et al. | |
| 7,233,494 B2 | 6/2007 | Campbell et al. | |
| 7,301,770 B2 * | 11/2007 | Campbell et al. ............. | 361/699 |
| 7,362,574 B2 | 4/2008 | Campbell et al. | |
| 7,578,337 B2 * | 8/2009 | Spokoiny et al. ............ | 165/80.4 |
| 2005/0280993 A1 | 12/2005 | Campbell et al. | |
| 2006/0126308 A1 | 6/2006 | Campbell et al. | |
| 2006/0250773 A1 | 11/2006 | Campbell et al. | |
| 2007/0119568 A1 | 5/2007 | Weber et al. | |
| 2007/0274045 A1 | 11/2007 | Campbell et al. | |
| 2007/0289729 A1 | 12/2007 | Campbell et al. | |
| 2007/0295480 A1 | 12/2007 | Campbell et al. | |

FOREIGN PATENT DOCUMENTS

EP    1 860 695 A2    11/2007

* cited by examiner

*Primary Examiner* — Tho V Duong
(74) *Attorney, Agent, or Firm* — Dennis Jung, Esq.; Kevin P. Radigan, Esq.; Heslin Rothenberg Farle & Mesiti P.C.

(57) ABSTRACT

A cooling apparatus and method of fabrication are provided for facilitating removal of heat from a heat-generating electronic device. The method of fabrication includes: bonding a plurality of thermally conductive pin fins to a surface to be cooled, each pin fin including a stem with a bulb structure on its distal end; depositing material onto the plurality of thermally conductive pin fins to integrally form a jet impingement structure with the pin fins, wherein the distal ends of the plurality of thermally conductive pin fins form part of the jet impingement structure; and controlling the depositing of material onto the distal ends of the pin fins to form a plurality of jet orifices in the jet impingement structure, with the depositing resulting in the plurality of jet orifices automatically self-aligning between the plurality of thermally conductive pin fins.

20 Claims, 9 Drawing Sheets

COOLING APPARATUS AND METHOD OF FABRICATION THEREOF WITH JET IMPINGEMENT STRUCTURE INTEGRALLY FORMED ON THERMALLY CONDUCTIVE PIN FINS

TECHNICAL FIELD

The present invention relates to heat transfer mechanisms, and more particularly, to cooling apparatuses, cooled electronic modules and methods of fabrication thereof for removing heat generated by one or more electronic devices. Still more particularly, the present invention relates to cooling apparatuses and methods employing a plurality of thermally conductive pin fins bonded to a substantially planar main surface of a thermally conductive base, which comprises part of or is coupled to an electronic device to be cooled.

BACKGROUND OF THE INVENTION

As is known, operating electronic devices produce heat. This heat should be removed from the devices in order to maintain device junction temperatures within desirable limits, with failure to remove the heat resulting in increased device temperatures, potentially leading to thermal runaway conditions. Several trends in the electronics industry have combined to increase the importance of thermal management, including heat removal for electronic devices, including technologies where thermal management has traditionally been less of a concern, such as CMOS. In particular, the need for faster and more densely packed circuits has had a direct impact on the importance of thermal management. First, power dissipation, and therefore heat production, increases as device operating frequencies increase. Second, increased operating frequencies may be possible at lower device junction temperatures. Further, as more and more devices are packed onto a single chip, heat flux (Watts/cm$^2$) increases, resulting in the need to remove more power from a given size chip or module. These trends have combined to create applications where it is no longer desirable to remove heat from modern devices solely by traditional air cooling methods, such as by using air cooled heat sinks with heat pipes or vapor chambers. Such air cooling techniques are inherently limited in their ability to extract heat from an electronic device with high power density.

The need to cool current and future high heat load, high heat flux electronic devices therefore, mandates the development of aggressive thermal management techniques, such as using liquid cooling. Various types of liquid coolants provide different cooling capabilities. In particular, fluids such as refrigerants or other dielectric liquids (e.g., fluorocarbon liquid) exhibit relatively poor thermal conductivity and specific heat properties, when compared to liquids such as water or other aqueous fluids. Dielectric liquids have an advantage, however, in that they may be placed in direct physical contact with electronic devices and interconnects without adverse affects such as corrosion or electrical short circuits. Other cooling liquids, such as water or other aqueous fluids, exhibit superior thermal conductivity and specific heat compared to dielectric fluids. Water-based coolants, however, must be kept from physical contact with electronic devices and interconnects, since corrosion and electrical short circuit problems are likely to result from such contact. Various methods have been disclosed in the art for using water-based coolants, while providing physical separation between the coolants and the electronic device(s). With liquid-based cooling apparatuses, however, it is still necessary to attach the cooling apparatus to the electronic device. This attachment results in a thermal interface resistance between the cooling apparatus and the electronic device. Thus, in addition to typical liquid cooling issues regarding sealing, clogging due to particulate contamination, thermal conductivity of the cooling apparatus, effectiveness of the interface to the electronic device as well as the thermal expansion match between the cooling apparatus and the electronic device and manufacturability, need to be addressed. The invention disclosed herein presents a high-performance liquid cooling apparatus and method of fabrication that addresses the above-noted considerations for liquid-cooling-based apparatuses.

SUMMARY OF THE INVENTION

The shortcomings of the prior art are overcome and additional advantages are provided through the provision of a method of fabrication a cooling apparatus. The method includes: providing a plurality of thermally conductive pin fins extending from a surface to be cooled to facilitate transfer of heat therefrom, each pin fin of the plurality of thermally conductive pin fins comprising a stem with a bulb structure adjacent to a distal end thereof; depositing material onto the bulb structures at the distal ends of the plurality of thermally conductive pin fins to form a jet impingement structure integral therewith, wherein the bulb structures at the distal ends of the plurality of thermally conductive pin fins integrally form part of the jet impingement structure; and controlling the depositing of material onto the bulb structures at the distal ends of the plurality of thermally conductive pin fins to form a plurality of jet orifices in the jet impingement structure, wherein the depositing results in the plurality of jet orifices automatically self-aligning between the plurality of thermally conductive pin fins.

In another aspect, a cooling apparatus is provided which includes: a liquid coolant supply comprising a jet impingement structure, the jet impingement structure including a plurality of jet orifices for directing liquid coolant onto a surface to be cooled. The jet impingement structure further includes a plurality of thermally conductive pin fins extending from the jet impingement structure towards the surface to be cooled to facilitate transfer of heat from the surface to be cooled. The jet impingement structure, with the plurality of thermally conductive pin fins extending therefrom, is a single, monolithic structure.

In another aspect, a cooled electronic module is provided which includes a substrate with at least one heat generating electronic device attached thereto. The module further includes a cooling apparatus for cooling a surface to be cooled of the at least one heat generating electronic device. The cooling apparatus includes: a liquid coolant supply comprising a jet impingement structure. The jet impingement structure includes a plurality of jet orifices for directing liquid coolant onto a surface to be cooled. The jet impingement structure further includes a plurality of thermally conductive pin fins extending therefrom towards the surface to be cooled to facilitate transfer of heat from the surface to be cooled. The jet impingement structure, with the plurality of thermally conductive pin fins extending therefrom, is a single, monolithic structure, wherein the jet impingement structure is integrally formed with the plurality of thermally conductive pin fins extending therefrom.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

As used herein, "electronic device" comprises any heat generating electronic component of a computer system or other electronic system requiring cooling. In one example, the electronic device includes an integrated circuit chip. The term "cooled electronic module" includes any electronic module with cooling and at least one electronic device, with single chip modules and multichip modules being examples of an electronic module to be cooled.

Generally stated, provided herein is an enhanced cooling apparatus and method of fabrication which allow for high heat transfer rate from a surface of an electronic device to be cooled using a direct or indirect liquid cooling approach. In one embodiment, the cooling liquid comprises a water-based fluid, and the cooling apparatus is employed in combination with a passivated electronic substrate assembly. However, the concepts disclosed herein are readily adapted to use with other types of coolant. For example, the coolant may comprise a brine, a fluorocarbon liquid, a liquid metal, or other similar coolant, or a refrigerant, while still maintaining the advantages and unique features of the present invention.

As discussed above, the ever-increasing rise of cooling requirements of commercial computer products has been driven by an exponential increase in microprocessor performance over the last decade. Almost all electrical energy consumed by an integrated circuit chip package is released into the surroundings as heat, which places a significant burden on the cooling apparatus. Existing cooling technologies typically utilize air to carry heat away from an integrated circuit chip, and reject it to the ambient. Heat sinks with heat pipes or vapor chambers are the most commonly used air-cooling devices. These cooling techniques are, however, inherently limited with respect to their ability to extract heat from semiconductor devices with high power densities. Thus, the need to cool current and future high heat load and high heat flux electronics mandates the development of aggressive thermal management techniques, such as liquid-cooling using jet impingement techniques, and using finned cold plate structures. Typical issues to be addressed in liquid-cooling are sealing, clogging due to particle contamination, thermal conductivity of cold plate material, effectiveness of the thermal interface to the electronics, thermal expansion mismatch between the cold plate and electronics, and manufacturability. These issues are taken into account by the cooling apparatuses and methods of fabrication thereof described below.

Figure 1:
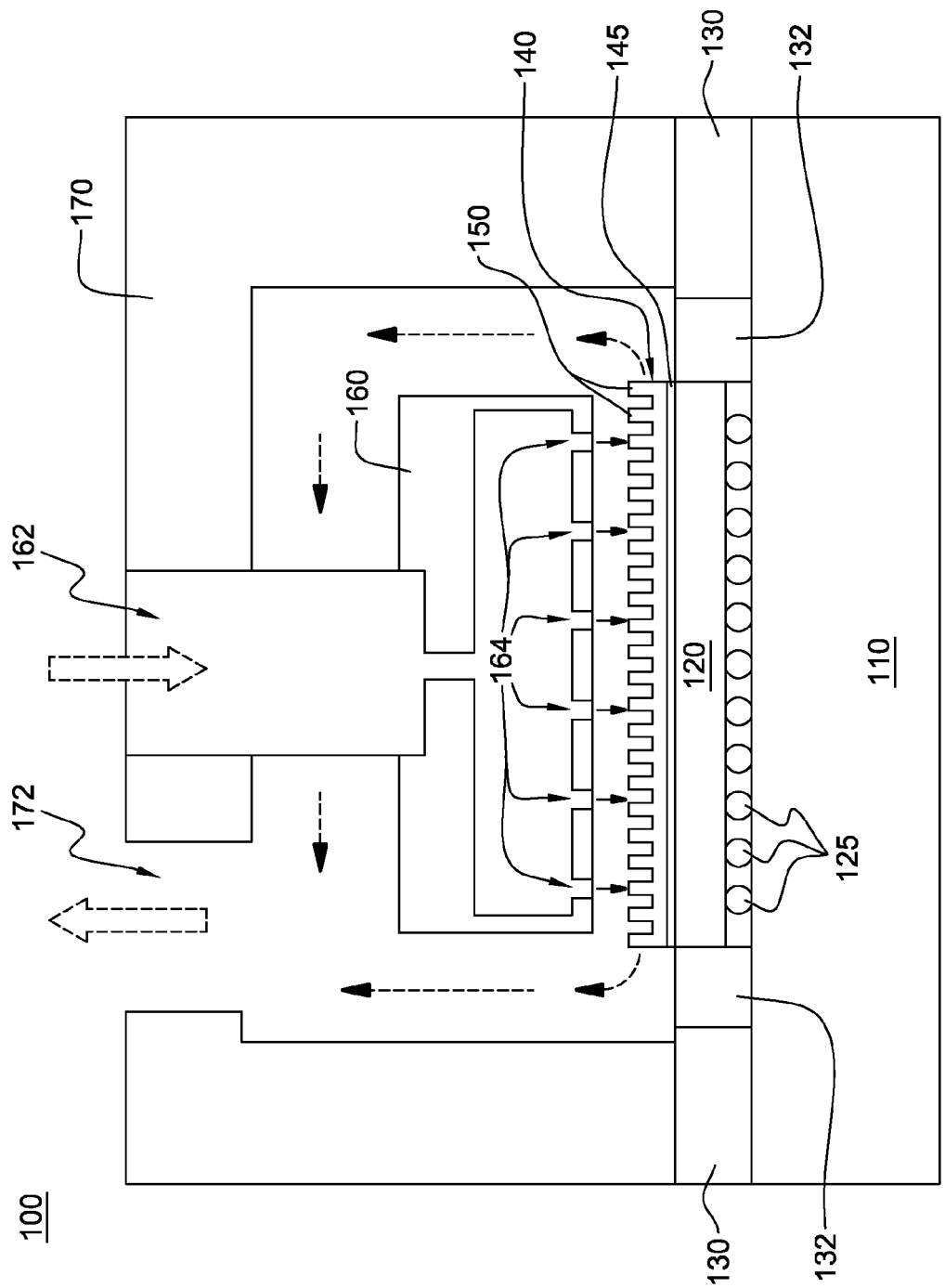
FIG. 1 is a cross-sectional elevational view of one embodiment of a liquid-cooled electronic module.

Reference is now made to the drawings, wherein the same reference numbers used throughout different figures designate the same or similar components. FIG. 1 depicts one embodiment of a cooled electronic module, generally denoted 100. In this embodiment, cooled electronic module 100 includes a substrate 110, which may include conductive wiring (not shown) on an upper surface thereof and/or embedded therein. An integrated circuit chip 120 is electrically connected to the wiring of substrate 110 via, for example, solder ball connections 125. A sealing structure 130 and sealant 132 facilitate isolation of the active circuit portion of the integrated circuit 120 from liquid coolant within the module. A microstructure heat sink 140 is coupled to integrated circuit chip 120 via a thermal interface 145 (e.g., silicone, epoxy, solder). A housing 170 is hermetically sealed to sealing structure 130 via, for example, solder or brazing. Within the housing, a plurality of pin fins 150 extend from microstructure heat sink 140 into a coolant flow path defined by the housing. In one example, these pin fins each comprise a discrete pin fin fabricated of copper. The coolant flow path includes an inlet manifold structure 160 disposed above the microstructure heat sink 140. Inlet manifold structure 160 includes an inlet 162 and a plurality of orifices 164, which may comprise micro-scaled jet orifices. Housing 170 includes a liquid coolant outlet 172 for removal of coolant after contacting the plurality of pin fins 150 and the base of microstructure heat sink 140. Note that although the manifold approach described above employs central coolant inlets with peripheral outlets, a number of different approaches may be incorporated without departing from the scope of the present invention.

The cooled electronic module of FIG. 1 has difficulties associated therewith. These include the making of the orifice plate and pin fins as two separate structures which are then joined together. This means that there can be stress exerted on the heat transfer structure during assembly of the orifice plate to the pin fin surface. Additionally, it is difficult to align the jet orifices with the inter-fin open volumes so as to minimize pressure drop. This is especially true in the case of dense pin-fin arrays where it is undesirable for the pins to be directly under a jet orifice (thereby obstructing the jet). Further, it can be difficult to simultaneously achieve high pin aspect ratios, high density pin fins, and small jet orifice diameters using an embodiment such as depicted in FIG. 1. The cooling apparatus and method of fabrication described hereinbelow address these difficulties.

Figure 2A:
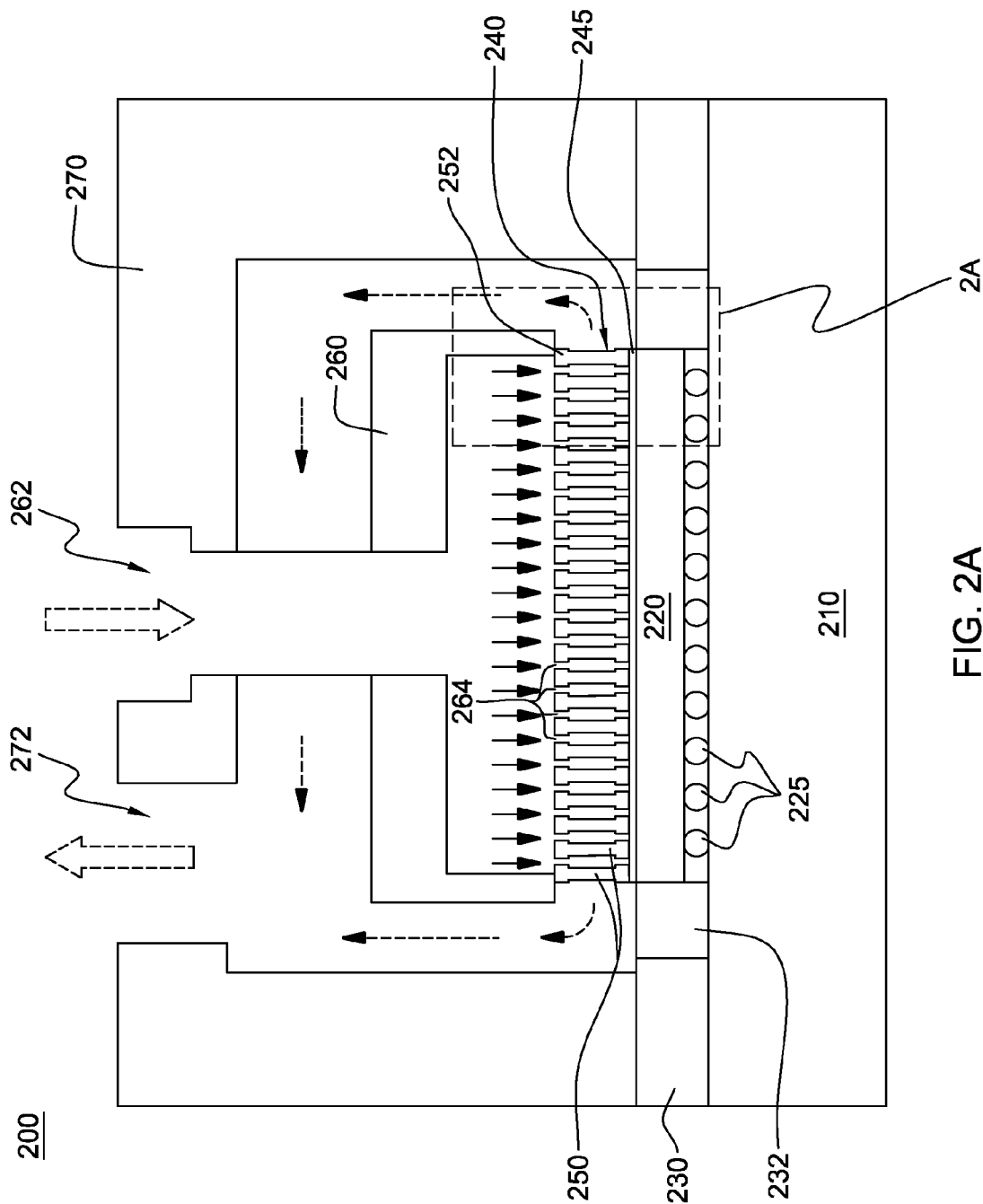
FIG. 2A is a cross-sectional elevational view of one embodiment of a liquid-cooled electronic module employing a cooling apparatus, in accordance with an aspect of the present invention.
Figure 2B:
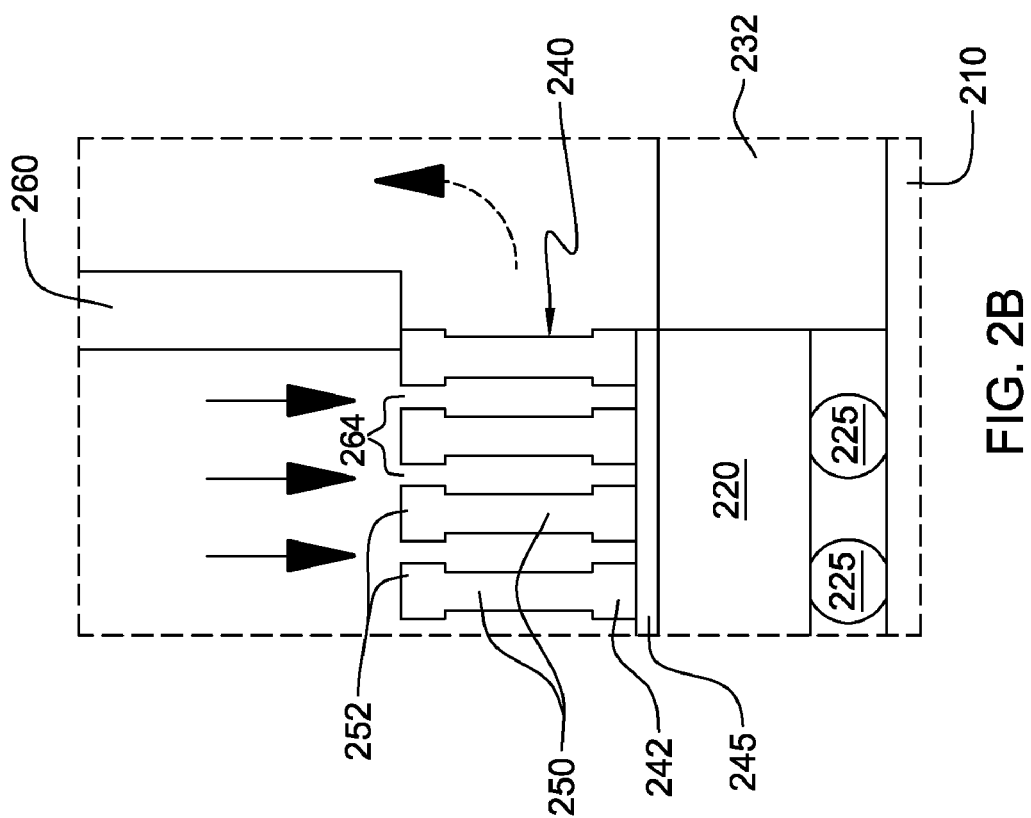
FIG. 2B is an enlarged view of a portion of the liquid-cooled electronic module of FIG. 2A, in accordance with an aspect of the present invention.

FIGS. 2A & 2B depict one embodiment of a cooled electronic module, generally denoted 200, in accordance with an aspect of the present invention. In this embodiment, the cooled electronic module is depicted as a single chip module, and the monolithic structure comprising the pin fins and jet impingement plate are directly attached to, for example, the back side of an integrated circuit chip.

More particularly, cooled electronic module 200 includes a substrate 210, which may include conductive wiring (not shown) on an upper surface thereof and/or embedded therein. Integrated circuit chip 220 is electrically connected to the wiring of substrate 210 via, for example, solder ball connections 225. A sealing structure 230 and sealant 232 facilitate isolation of the active circuit portion of an integrated circuit chip 220 from liquid coolant within the module.

The cooling apparatus 240 is a thermally conductive structure which is coupled to integrated circuit chip 220 via a metallization layer 245. As illustrated in FIG. 2B, monolithic structure 240 comprises a plurality of pin fins 250 extending from this interface metallization. The fabrication method described herein below results in formation of a base plate 242 at the metallization layer with the surface to be cooled, and formation of a jet impingement structure 252 with a plurality of jet orifices 264 defined therein, at the distal end of the pin fins 250.

A peripheral housing 270 is hermetically sealed to sealing structure 230 via, for example, solder or brazing. Within the peripheral housing, a manifold structure 260 is bonded to the integrally formed jet impingement structure and plurality of thermally conductive pin fins at the periphery thereof using metallurgical bonding, or other means. Coolant enters the cooled electronic module via an inlet port 262, passes into the illustrated inlet plenum, and through jet orifices 264, and impinges on the base plate of the pin fins, before exhausting to the periphery of the monolithic structure, while flowing around the pin fins. From the periphery of the monolithic structure, the hot coolant exits the module via an exit plenum in fluid communication with an exit port 272.

FIGS. 3A-7D illustrate one method of fabricating a monolithic structure, such as monolithic structure 240 depicted in FIGS. 2A & 2B.

Figure 3A:
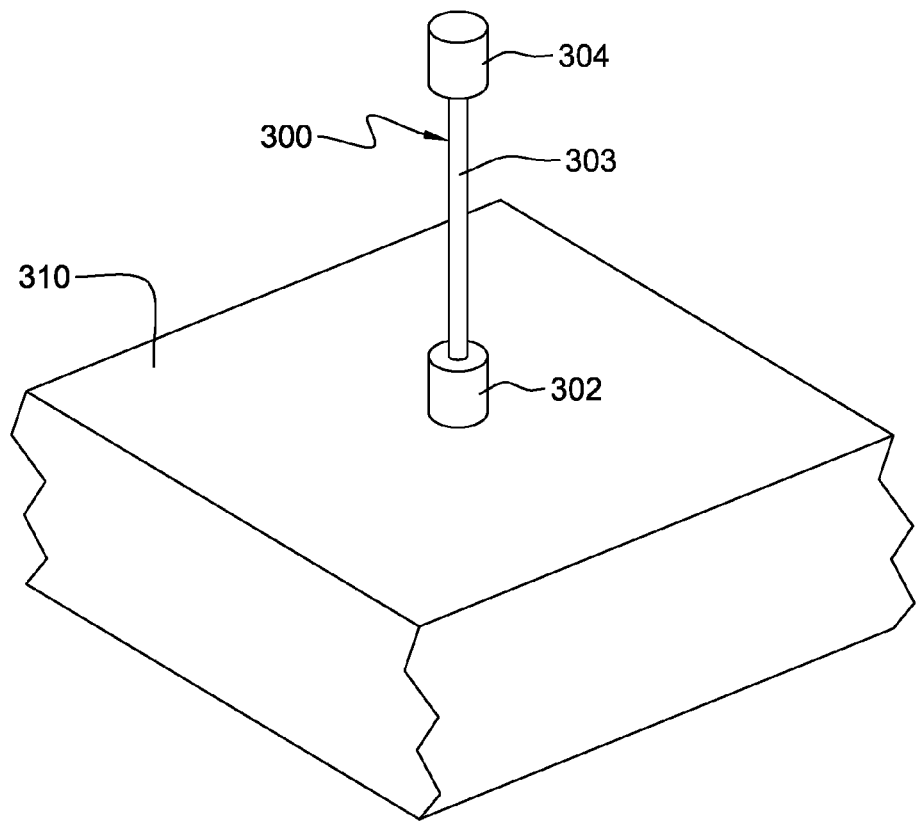
FIG. 3A is an isometric view of one embodiment of a thermally-conductive pin fin wire-bonded to a thermally conductive base during a cooling apparatus fabrication method, in accordance with an aspect of the present invention.

Referring first to FIG. 3A, a single pin fin 300 is illustrated wire-bonded to a surface to be cooled 310. The wire-bonding operation results in a stem 303 and bulb structures 302, 304 at the ends thereof. Bulb structure 302 is disposed adjacent to the proximal end of the pin fin, while bulb structure 304 is adjacent to the distal end of the pin fin. The pin fin 300 may be fabricated of gold or copper, with an exemplary height of 1 mm or less, and a diameter of 0.025-0.1 mm. The bulb structure thickness is approximately equal to twice the stem diameter. The surface 310 to be cooled may comprise a cold plate base, or, for example, a surface of an electronic device to be cooled. An appropriate metallization layer is assumed to reside on the upper surface 310 to be cooled. By way of example, the metallization layer may comprise: copper, nickel, gold, silver, or platinum. One example could be a CuNiAu layer. Alternatively, more sophisticated metalization layers could also be used. Two examples of an advanced layer would be CrNiAu (Chrome Nickel Gold) and TiNiAu (Titanium Nickel Gold). For both these layers, the first named metal is the adhesion layer (Cr or Ti), the second layer is the wetting barrier layer (Ni) and the third is the anti-oxidation layer (Au). In the case of a CrNiAu metallization layer, the Cr layer may be approximately 500 Angstroms (A) thick, the Ni layer approximately 5000 A thick, and the Au layer approximately 500 A thick. The use of a chip metallization layer enables a metallurgical bond to be created between the wire-bonded pin fins and the chip, which has thermal and structural benefits.

In one embodiment, the wire-bonding described herein is a diffusion weld-bond process, wherein ultrasonic activation is employed along with a controlled, downward force, in order to create a physical environment that is conductive to plastic deformation and intermolecular diffusion between the pin fin (i.e., the lower bulb structure 302) and the metallized base. A diffusion weld-bond thus results under these conditions, whereby the plastic deformation at microscopic length scales causes the metal to flow in slip and shear planes across each part of the pin fin-substrate interface, thus forming a metallurgical diffusion bond. An electronic flame-off (EFO) operation at the distal end of the pin fin results in the upper bulb structure 304 being formed.

Figure 3B:
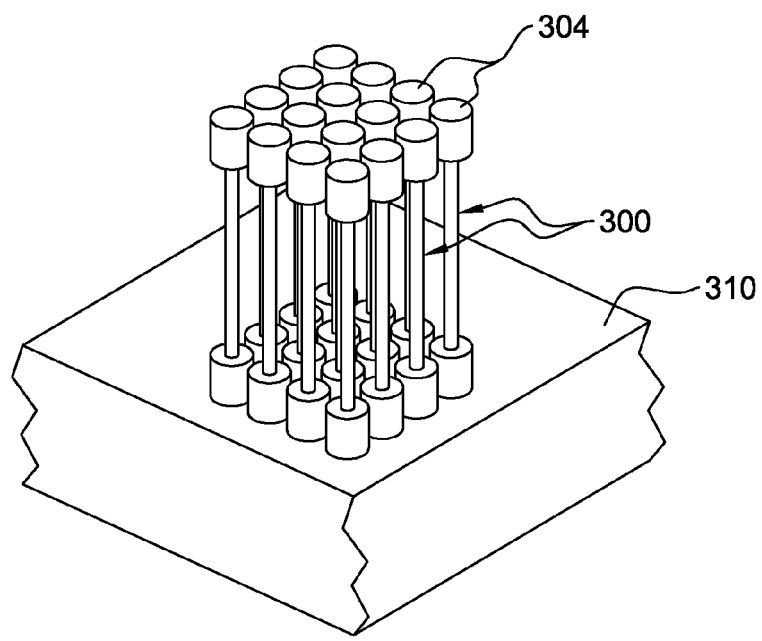
FIG. 3B is an isometric view of one embodiment of a plurality of thermally conductive pin fins wire-bonded to the thermally conductive base during a cooling apparatus fabrication method, in accordance with an aspect of the present invention.

FIG. 3B illustrates an array of wire-bonded pin fins 300 made up of individual pin fins, such as depicted in FIG. 3A. Process times for forming the diffusion bonds for a pin fin are less than 20 milliseconds. Thus, to create a high performance pin fin array such as depicted in FIG. 3B, wherein, for example, 2,500 pin fins are employed to cool a surface of one 1 cm² (and hence, 2,500 bonds), the bonding process time can be estimated to be about 50 seconds. This is a reasonable time for cost effective production of a single cooling apparatus. Another technique which could be used to create enhanced heat transfer pin fin structures is a wedge-bonding approach. The process times for wedge-bonding have been reported to be less than 80 milliseconds per bond, which again allows for a practical implementation of the concepts described herein.

Advantageously, the structures described herein provide an excellent thermal interface due to the metallurgical nature of a wire-bond, and due to the absence of a solder or braze interface, which would add a significant thermal resistance between the pin fins and the surface to be cooled. The wire-bonding approach employed herein is particularly beneficial when creating a silicon-to-copper pin bond, for example, for a dense array of pin fins. The pin fin-to-substrate bonds are created using a wire-bonding process that employs ultrasonic activation, and establishes a diffusion weld-bond between surfaces that are metallurgically clean, e.g., free of oxides, and which is highly energetic. These interface properties make for an excellent thermal interface of low thermal resistance. The bulb structures (or hemispherical-shaped ends) of the pin fins allow for a greater surface area at the bond, approximately 4-16 times the cross-sectional area of the stem portion itself, thus significantly increasing the contact area, thereby reducing the interface/contact thermal resistance at the interface. The thermal interface resistance at this pin-to-base interface is inversely proportional to the area of contact. As described further below, this interface is further enhanced by the deposition of material onto the pin fins. Additionally, the bulb-shaped, weld-bond allows for "thermal merging" as the heat flows from the large cross-sectional area of the thermally conductive base, to the smaller cross-sectional area of the pin fins, thereby reducing the constriction resistance of the fin structure to heat flow.

Figure 4A:
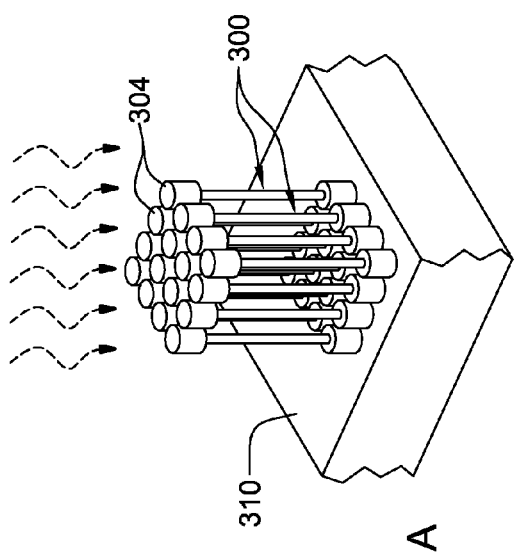
FIG. 4A is an isometric view of the structure of FIG. 3B, illustrating deposition of material onto the bulb structures adjacent to the distal ends of the pin fins, in accordance with an aspect of the present invention.
Figure 4B:
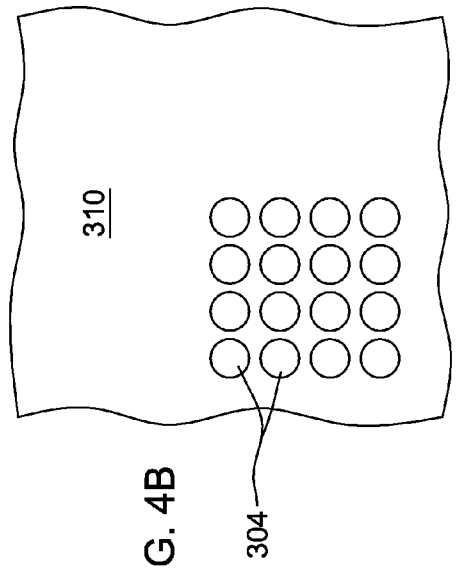
FIG. 4B is a top plan view of the structure of FIG. 4A, in accordance with an aspect of the present invention.

FIGS. 4A & 4B depict an isometric and to plan view, respectively, of an array of wire-bonded pin fins 300 bonded to a surface 310 to be cooled. In FIGS. 4A & 4B, the inter-pin gaps between the stems and the bulb structures 304 at the distal ends of the stems can be seen. Due to the geometry of the wire-bonded pin array, the gaps between the pins are much larger at the stem cross-section than at the bulb cross-sections. FIG. 4A also depicts copper/gold electroplating of the pin fins (via the dotted arrows). This electroplating operation can be carried out after the wire-bonding has been completed. While electroplating is discussed in this example, the deposition of material could alternatively be a different process, for example, CVD diamond deposition, or metal deposition using a different process.

Figure 5A:
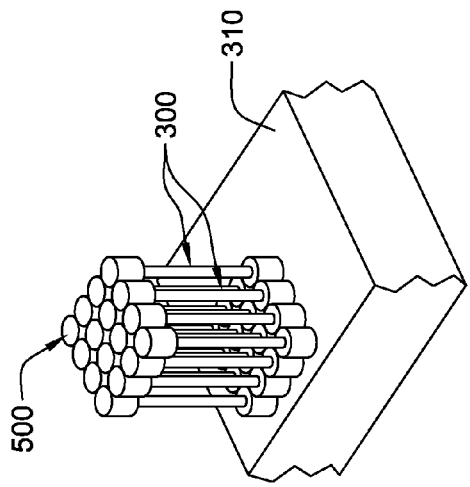
FIG. 5A is an isometric view of the structure of FIG. 4A, after deposition of further material onto the bulb structures at the distal ends of the pin fins, and illustrating contacting of the enlarged bulb structures at the distal ends of the pin fins, beginning formation of the jet impingement structure, in accordance with an aspect of the present invention.
Figure 5B:
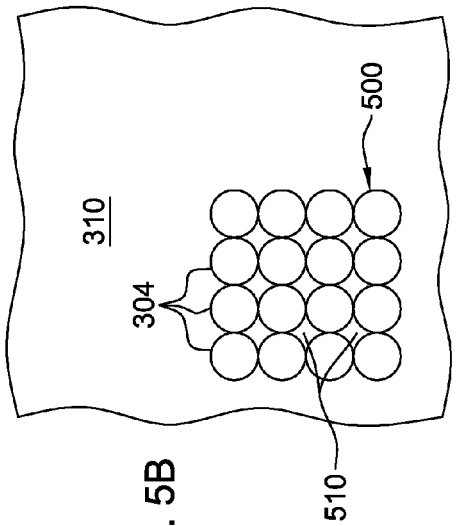
FIG. 5B is a top plan view of the structure of FIG. 5A, in accordance with an aspect of the present invention.

FIGS. 5A & 5B illustrate isometric and top plan views, respectively, of the wire-bonded array structure of FIGS. 4A & 4B after partial completion of electroplating or material deposition. In this embodiment, a jet impingement structure 500 has begun to be formed by the contacting of the bulb structures 304 at the distal ends of the pin fins. Further, openings 510 are defined between adjacent pin fins, as illustrated in FIG. 5B. As the electroplated material is deposited onto the original wire-bonded pin fins, the diameters of the pin fins at the stems and at the bulb structures, at both the proximal and distal ends of the stems, begin to increase in dimension. FIGS. 5A & 5B thus illustrate an intermediate step in the deposition process, wherein the diameters of the adjacent bulb structures physically contact.

Figure 6A:
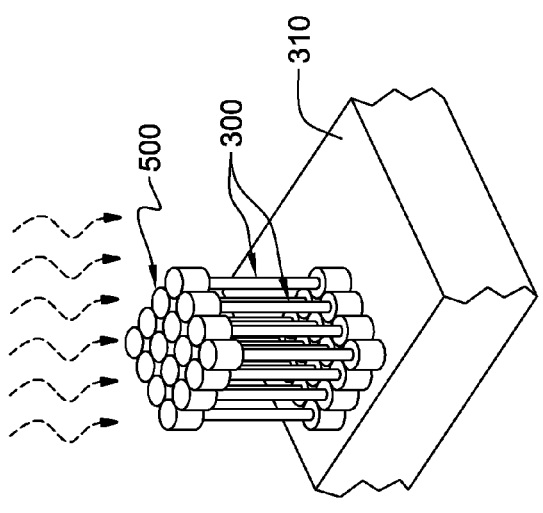
FIG. 6A illustrates further deposition of material onto the bulb structures at the distal ends of the pin fins of FIG. 5A to complete formation of the jet impingement structure, in accordance with an aspect of the present invention.
Figure 6B:
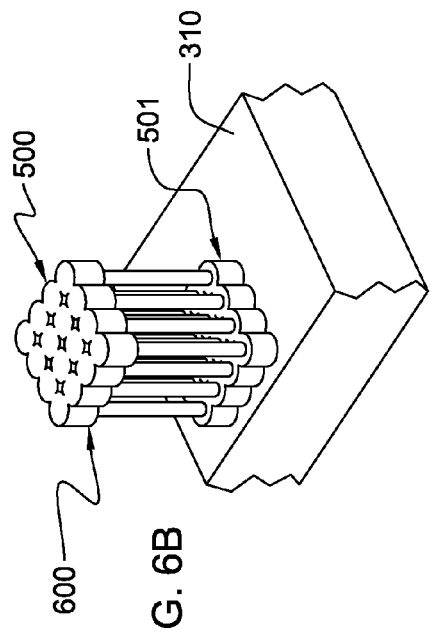
FIG. 6B is an isometric view of one embodiment of the resultant jet impingement structure formed by deposition of material onto the pin fins, and illustrating a plurality of jet orifice openings defined within the jet impingement structure, in accordance with an aspect of the present invention.
Figure 6C:
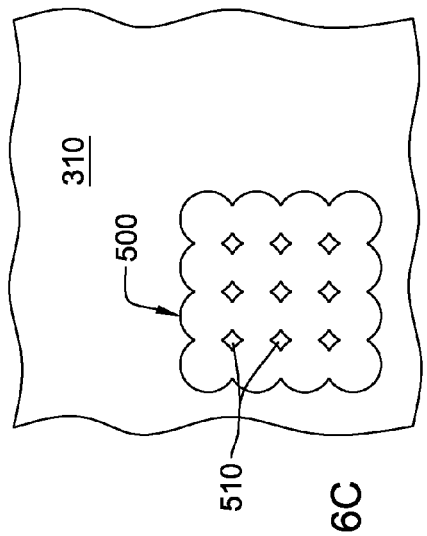
FIG. 6C is a top plan view of the structure of FIG. 6B, in accordance with an aspect of the present invention.

FIG. 6A is an isometric view of the structure of FIG. 5A, illustrating continued electroplating of the structure. In the isometric and top plan views of FIGS. 6B & 6C, respectively, the resultant monolithic structure 600 is illustrated, wherein a plate-like, jet impingement structure 500 results from the deposition of material onto the bulb structures at the distal ends of the pin fins. A similar base plate structure 501 is also formed at the interface between the pin fins and the surface 310 to be cooled. After the continued electroplating, the top and bottom bulb structures have respectively merged to form the top and bottom rigid, solid structures illustrated. If electroplating is continued for too long a period, the solid top bulb structure would loose the openings 510 within the structure. However, if electroplating is controlled to only continue for a specified period of time after, for example, the step depicted in FIGS. 5A & 5B, then after merging, there will remain openings in the jet impingement structure 500. FIGS. 6B & 6C illustrate these openings, referred to herein as jet orifices 510. Jet orifices 510 are, in one embodiment, each diamond-shaped in cross-section, and include a curved inner surface defining the opening.

FIGS. 7A-7D illustrate a further example of how the geometry and dimensions of the components of the wire-bonded pin fin array change during the different steps of the fabrication process described herein.

Figure 7B:
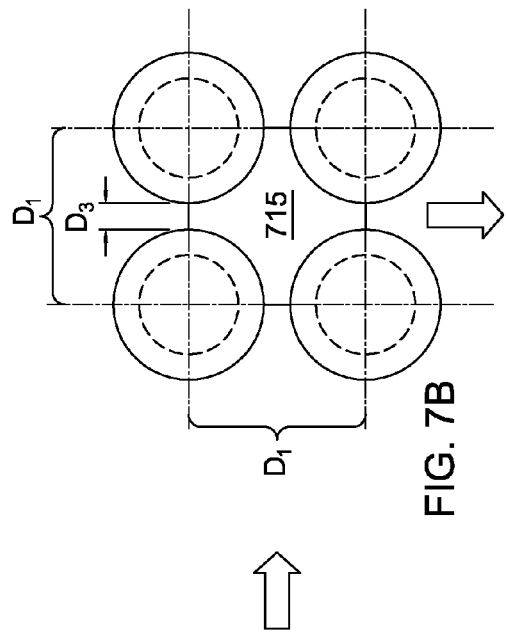
FIGS. 7A-7D are top plan views of the pin fin structures of FIGS. 3A-6C, illustrating the build-up of material onto the bulb structures of adjacent pin fins until the jet impingement structure is achieved with a jet orifice formed in the middle thereof, which is self-aligned between the adjacent pin fins, in accordance with an aspect of the present invention.
Figure 7C:
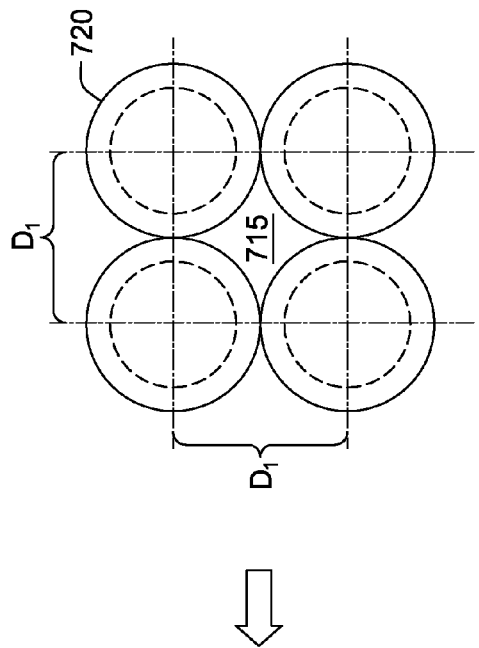
Figure 7A:
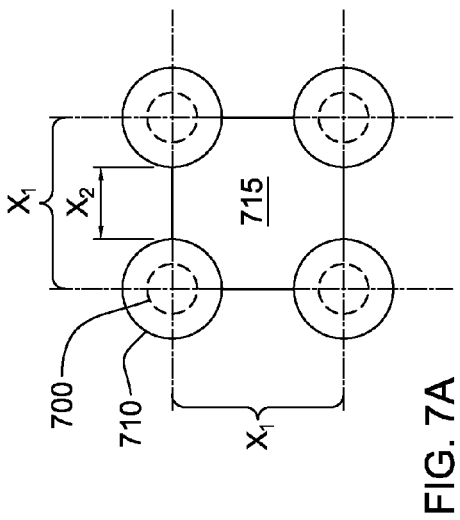
Figure 7D:
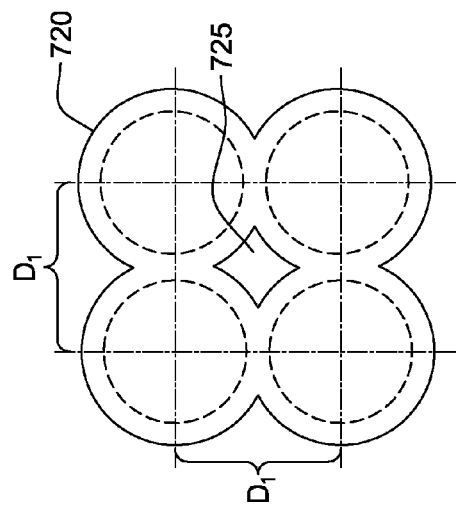

FIG. 7A illustrates an original wire-bonded pin array wherein four pin fins are equally spaced center-to-center a distance $x_1$ apart, with intervening space $x_2$ between the outer surfaces of the bulb structures 710 at the distal ends of the stems 700. As one example, the original wire-bonded pin array is assumed to have a center-to-center pitch of 0.0175 mm (7 mils), a total pin height of 1 mm, a pin stem diameter of 0.05 mm (2 mils), and a top and bottom bulb structure diameter of 0.1 mm (4 mils). The gap $x_2$ between the circumferences of the top bulb structures is 0.075 mm (3 mils). FIG. 7A also illustrates the base plate 715 to which the pin fins are bonded. FIG. 7B illustrates an intermediate step in which material deposition of 0.025 mm thickness (1 mil) on the top and bottom bulb structures results in a diameter of 0.15 mm (6 mils), and a stem diameter of 0.1 mm (4 mils). FIG. 7C illustrates the next intermediate step after another 0.0125 mm or 0.075 mm total material deposition (total 1.5 mils), wherein the pin stem diameter is 0.125 mm (5 mils), and the top and bottom bulb structures have diameters of 0.175 mm (7 mils). After this second intermediate stem, the outside circumferences of the top bulbs have merged. FIG. 7D illustrates a final geometry after another 0.0125 mm (½ mil) deposition, which results in a pin stem diameter of 0.15 mm (6 mils) and forces the bulb structures to merge, leaving only a small diamond-shaped opening 725. This diamond-shaped opening is the jet impingement orifice, through which an underlying portion of base plate 715 is exposed.

Those skilled in the art will note from the above discussion that presented herein is a high performance cooling apparatus, liquid cooled electronic module, and methods of fabrication thereof. The cooling apparatus and methods of fabrication presented significantly improve on existing liquid-cooled apparatus designs. The result is an extremely dense and efficient pin fin structure with very small jet orifices having a unique, diamond-shaped configuration. Further, the jet impingement structure is integrated with the pin fin structures, resulting in a monolithic structure. The bulb structures at the distal ends of the pin fins are integrated within and form part of the jet impingement structure.

Advantageously, described herein is a liquid-cooled electronic module which employs a jet impingement structure wherein jet orifices are perfectly aligned between pin fins so that liquid coolant is accurately injected into the open volumes between the ultra-dense arrays of thermally conductive pins attached to the surface to be cooled. This is significant, since as noted above, if a jet orifice is aligned over a pin fin, pumping energy is lost due to lost fluid momentum and turbulence. The fabrication method described herein ensures the perfect self-alignment of orifices to pin fins.

Additionally, a jet impingement structure is described herein with inherently a perfect zero gap between the vertically-extending thermally conductive pins and the horizontally-oriented jet impingement structure. This is because the two structures are integrated as a single, monolithic structure, fabricated from the same material. This is advantageous since a gap or poorly created interface can result in coolant flow bypassing the pins, which means that some part of the pumping energy and coolant flow would be lost. Also, for such a dense jet orifice array, and dense pin array, using a solder or epoxy interface would invariably result in clogging of the jet orifices or pin fin structures.

Described herein is a jet impingement structure that is structurally integrated with the thermally conductive pin fins. Specifically, both structures are fabricated of the same material so that there is no interface between the structures, thus providing increased rigidity to the pin fin array. The jet orifices formed in the jet impingement structure are, in one embodiment, diamond-shaped with concave curvature to the sides of the diamond. This means that the periphery of the liquid jet passing through the orifice is perfectly aligned to a quarter-portion of the circumference of the four adjacent pins. The extremely small orifices and dense pin arrays are made possible using the fabrication approach described herein.

In one embodiment, the method of fabrication presented employs wire-bonding and metal deposition. A nearly 1:1 ratio between the number of pins and the number of jet orifices is achieved. No prior approaches can achieve a nearly 1:1 ratio, while also aligning the jet orifices and the pin fin structures preferentially. In the present invention, the resultant jet impingement structure is formed integral with the thermally conductive pin fins, which in turn are metallurgically bonded to the surface to be cooled, as described above.

Figure 8C:
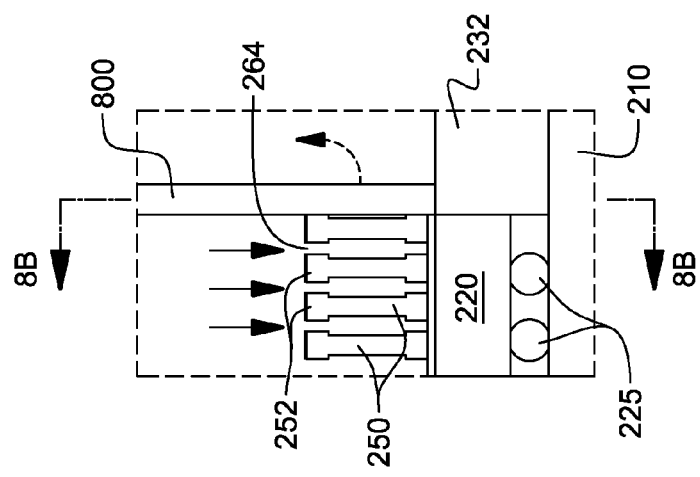
FIG. 8C is a cross-sectional elevational view of the structure of FIG. 8B, taken along line 8C-8C, in accordance with an aspect of the present invention.
Figure 8B:
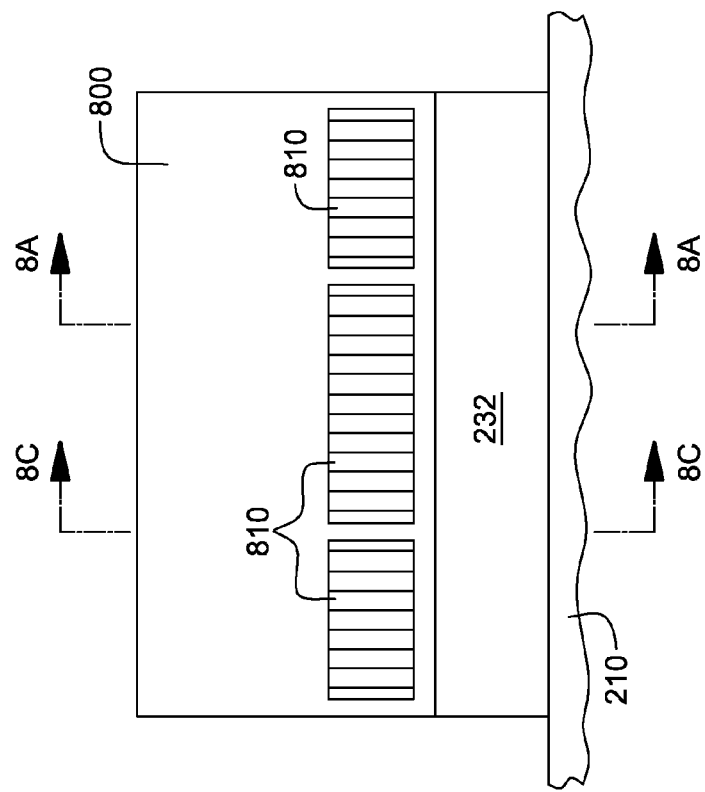
FIG. 8B is a cross-sectional elevational view of the structure of FIG. 8A, taken along line 8B-8B, in accordance with an aspect of the present invention.
Figure 8A:
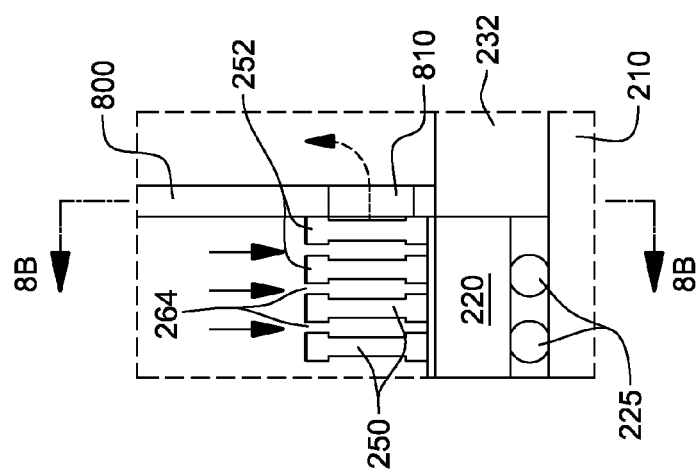
FIG. 8A is a partial cross-sectional elevational view of an alternate embodiment of a liquid-cooled electronic module, wherein the liquid coolant manifold structure engages sealant adjacent to the electronic device to be cooled, and the jet impingement structure, with the plurality of thermally conductive pin fins extending therefrom, resides within the liquid coolant manifold structure, in accordance with an aspect of the present invention.

FIGS. 8A-8C depict an alternate embodiment of a coolant manifold structure 800 of a liquid-cooled electronic module, in accordance with an aspect of the present invention. The partial elevational view of FIG. 8A is analogous to the partial elevational view of FIG. 2B, discussed above. The difference, however, is that coolant manifold structure 800 does not contact the periphery of the jet impingement structure 252, but rather encircles the single, monolithic structure (comprising the plurality of pin fins 250 and the jet impingement structure 252) by, for example, being sized to seal to sealant 232 about the periphery of the monolithic structure. As noted above, sealant 232 encircles integrated circuit chip 220, which is disposed above substrate 210. In one example, integrated circuit chip 220 is electrically connected to wiring of substrate 210 via, for example, solder ball connections 225. Liquid coolant passes through jet orifices 264 in jet impingement structure 252, formed as described above. After impinging upon the base plate of the monolithic structure, as well as the exposed portion of the surface to be cooled, the heated coolant exhausts through openings 810 in coolant manifold structure 800 for return through the exit plenum (not shown) and the exit port.

FIG. 8B is a side elevational view of coolant manifold structure 800, which provides structural strength and rigidity to the coolant manifold. In one example, the coolant manifold structure 800 is sealed in a fluid-tight seal to sealant 232. The peripheral exhaust openings 810 are illustrated in FIG. 8B.

In FIG. 8C, a further cross-section is illustrated through the coolant manifold structure 800 to depict the continuous nature in certain regions of the coolant manifold structure, and thus the greater structural strength and rigidity of this implementation. In this implementation, the coolant manifold structure 800 encircles the plurality of pin fins 250 and the jet impingement structure 252 at their periphery.

Figure 9:
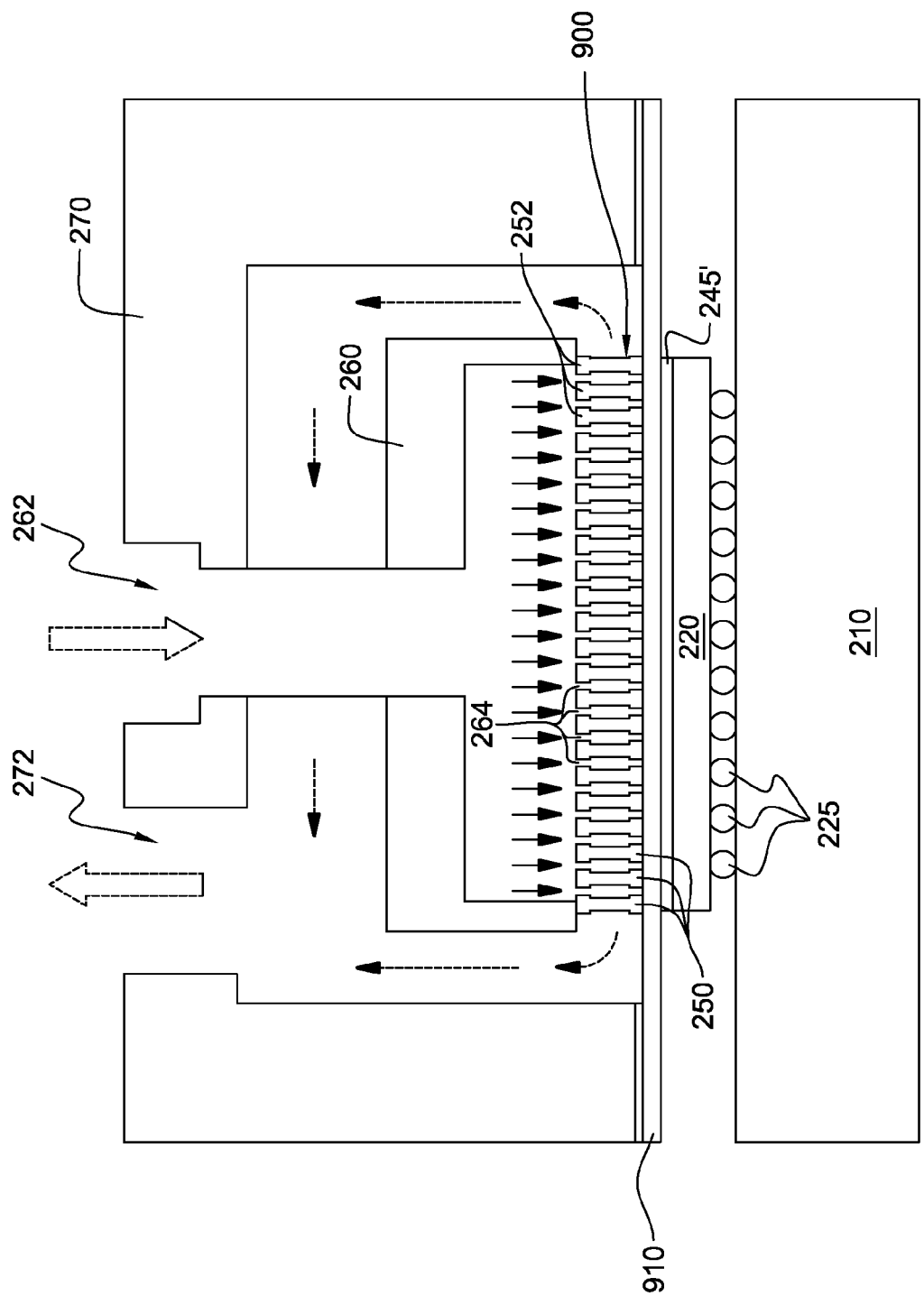
FIG. 9 is a cross-sectional elevational view of an alternate embodiment of a liquid-cooled electronic module, in accordance with an aspect of the present invention.

FIG. 9 illustrates a further alternate embodiment of a liquid-cooled electronic module, in accordance with an aspect of the present invention. This module is similar to the structure of FIGS. 2A & 2B, but with the addition of a cold plate base 910 to which the single, monolithic structure 900 (comprising the plurality of pin fins 250 and jet impingement structure 252) attaches. The opposite side of the cold plate base 910 is attached to the back side of an integrated circuit chip 220 employing, for example, a thermal and mechanical interface 245' (e.g., solder, epoxy or silicone). Liquid coolant flows within this structure, which includes the cold plate base, a housing 270 which is hermetically sealed to cold plate base 910 about the periphery thereof, and a coolant manifold structure 260 which seals about the periphery of the monolithic structure comprising the plurality of pin fins 250 and jet impingement structure 252. In this example, there is no need to use a sealing window and sealant to fluidically isolate the liquid coolant from the electronics on the underside of the integrated circuit chip 220. In this embodiment, the interface material 245' provides a mechanical joint, as well as a good thermal path for heat dissipation. It is also possible for the cold plate base to be mechanically bolted to the substrate 210, with the interface only serving a thermal function. If desired, the space between substrate 210 and cold plate base 910 can be filled with a dielectric material for enhanced stability. In operation, liquid coolant enters through inlet port 262 into an inlet plenum and is distributed to the plurality of jet orifices 264. After impinging on the cold plate base 910, the warmed coolant exits through an outlet plenum in fluid communication with outlet port 272 in housing 270.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A method comprising:
   providing a plurality of thermally conductive pin fins extending from a surface to be cooled to facilitate transfer of heat therefrom, each pin fin of the plurality of thermally conductive pin fins comprising a stem with a bulb structure adjacent to a distal end thereof;
   depositing material onto the bulb structures at the distal ends of the plurality of thermally conductive pin fins to form a jet impingement structure integral therewith, wherein the bulb structures at the distal ends of the plurality of thermally conductive pin fins integrally form part of the jet impingement structure; and
   controlling the depositing of material onto the bulb structures at the distal ends of the plurality of thermally conductive pin fins to form a plurality of jet orifices in the jet impingement structure, wherein the depositing results in the plurality of jet orifices automatically self-aligning between the plurality of thermally conductive pin fins.

2. The method of claim 1, wherein each pin fin of the plurality of thermally conductive pin fins is similarly sized and comprises a stem with a cross-sectional diameter smaller than a cross-sectional diameter of the bulb structure at the distal end thereof.

3. The method of claim 1, wherein the controlling comprises continuing with depositing of material onto the distal ends of the plurality of thermally conductive pin fins until the deposited material on the distal ends of the thermally conductive pin fins physically contacts and the plurality of jet orifices are achieved, wherein each jet orifice of the plurality of jet orifices is disposed in the jet impingement structure between four thermally conductive pin fins extending from the surface to be cooled.

4. The method of claim 1, wherein the providing comprises providing gold or copper pin fins for the plurality of thermally conductive pin fins, and wherein the depositing comprises one of electroplating metal onto the gold or copper pin fins, or depositing diamond or metal onto the plurality of thermally conductive pin fins.

5. The method of claim 1, wherein the providing comprises wire-bonding the plurality of thermally conductive pin fins to the surface to be cooled, wherein the surface to be cooled comprises a thermally conductive base plate or a portion of an electronic device to be cooled, the electronic device comprising at least one of an integrated circuit chip, multiple integrated circuit chips, a single chip module or a multichip module.

6. A cooling apparatus comprising:
   a liquid coolant supply comprising a jet impingement structure, the jet impingement structure comprising a plurality of jet orifices for directing liquid coolant onto a surface to be cooled; and
   wherein the jet impingement structure further comprises a plurality of thermally conductive pin fins extending therefrom towards the surface to be cooled to facilitate transfer of heat from the surface to be cooled, and wherein the jet impingement structure with the plurality of thermally conductive pin fins extending therefrom is a single, monolithic structure.

7. The cooling apparatus of claim 6, wherein the plurality of jet orifices of the jet impingement structure are self-aligned within the single, monolithic structure between the plurality of thermally conductive pin fins extending therefrom.

8. The cooling apparatus of claim 6, wherein the jet impingement structure is formed integral with the plurality of thermally conductive pin fins using electroplating or deposition of material onto bulb structures of the plurality of thermally conductive pin fins, wherein the bulb structures of the plurality of thermally conductive pin fins integrally form part of the jet impingement structure.

9. The cooling apparatus of claim 6, wherein the plurality of thermally conductive pin fins are wire-bonded to the surface to be cooled, and each pin fin comprises a stem with a bulb structure at each end, wherein the bulb structures at one end of the stems are integrated with the jet impingement structure, and the bulb structures at the other end of the stems facilitate bonding the stems to the surface to be cooled.

10. The cooling apparatus of claim 6, wherein the jet impingement structure and the plurality of thermally conductive pin fins extending therefrom each comprise a same material on an outer portion thereof, the same material defining the single, monolithic structure.

11. The cooling apparatus of claim 6, wherein the plurality of jet orifices are each diamond-shaped in cross-section with a concave curvature to at least one side of a surface thereof forming the diamond-shaped opening.

12. The cooling apparatus of claim 6, wherein the plurality of thermally conductive pin fins extend from the jet impingement structure in a uniform array, and wherein the plurality of jet orifices are aligned in a uniform array between the plurality of thermally conductive pin fins, and each jet orifice of the plurality of jet orifices is an opening with a non-circular cross-section.

13. The cooling apparatus of claim 6, wherein each pin fin of the plurality of thermally conductive pin fins is a discrete pin fin separately diffusion weld-bonded to and thermally merged with the surface to be cooled, and wherein the surface to be cooled comprises a portion of an electronic device to be cooled, the electronic device comprising at least one of an integrated circuit chip, multiple integrated circuit chips, or a single chip module or a multichip module.

14. The cooling apparatus of claim 13, wherein the electronic device to be cooled resides on a substrate, and wherein the cooling apparatus further comprises a housing sealably engaging the substrate to define a liquid coolant flow path within which the plurality of thermally conductive pin fins extend, wherein heat is transferred in part from the surface to be cooled of the electronic device through the plurality of thermally conductive pin fins to liquid coolant within the liquid coolant flow path when the cooling apparatus is employed to cool the electronic device.

15. A cooled electronic module comprising:
   a substrate and at least one heat-generating electronic device attached thereto; and
   a cooling apparatus for cooling the at least one heat-generating electronic device, the cooling apparatus comprising:
      a liquid coolant supply comprising a jet impingement structure, the jet impingement structure comprising a plurality of jet orifices for directing liquid coolant onto a surface to be cooled, the surface to be cooled being thermally coupled to the at least one heat-generating electronic device; and
   wherein the jet impingement structure further comprises a plurality of thermally conductive pin fins extending therefrom towards the surface to be cooled to facilitate transfer of heat from the surface to be cooled, and wherein the jet impingement structure with the plurality of thermally conductive pin fins extending therefrom is a single, monolithic structure.

16. The cooled electronic module of claim 15, wherein the plurality of jet orifices of the jet impingement structure of the cooling apparatus are self-aligned within the single, monolithic structure between the plurality of thermally conductive pin fins extending therefrom.

17. The cooled electronic module of claim 15, wherein the plurality of thermally conductive pin fins of the cooling apparatus are wire-bonded to the surface to be cooled, and each pin fin comprises a stem with a bulb structure at each end, wherein the bulb structures at one end of the stems are integrated within the jet impingement structure, and the bulb structures at the other end of the stems facilitate bonding the stems to the surface to be cooled.

18. The cooled electronic module of claim 15, wherein the jet impingement structure and the plurality of thermally conductive pin fins extending therefrom each comprise a same material on an outer portion thereof, the same material defining the single, monolithic structure.

19. The cooled electronic module of claim 15, wherein the plurality of jet orifices of the jet impingement structure of the cooling apparatus are each diamond-shaped in cross-section, and comprise a concave curvature to at least one side surface thereof forming the diamond-shaped opening.

20. The cooled electronic module of claim 15, wherein the plurality of thermally conductive pin fins of the cooling apparatus extend from the jet impingement structure in a uniform array, and wherein the plurality of jet orifices are aligned in a uniform array between the plurality of thermally conductive pin fins, and each jet orifice of the plurality of jet orifices is an opening with a non-circular cross-section.

* * * * *